(12) United States Patent
Simoni et al.

(10) Patent No.: US 9,176,157 B2
(45) Date of Patent: Nov. 3, 2015

(54) MICRO-ELECTROMECHANICAL STRUCTURE WITH LOW SENSITIVITY TO THERMO-MECHANICAL STRESS

(71) Applicant: Maxim Integrated Products, Inc., San Jose, CA (US)

(72) Inventors: Barbara Simoni, Bareggio (IT); Luca Coronato, Corsico (IT); Gabriele Cazzaniga, Rosate (IT)

(73) Assignee: Maxim Integrated Products, Inc., San Jose, CA (US)

( * ) Notice: Subject to any disclaimer, the term of this patent is extended or adjusted under 35 U.S.C. 154(b) by 358 days.

(21) Appl. No.: 13/705,680

(22) Filed: Dec. 5, 2012

(65) Prior Publication Data

US 2014/0298909 A1    Oct. 9, 2014

(51) Int. Cl.
| | |
|---|---|
| *G01P 15/125* | (2006.01) |
| *G01P 1/00* | (2006.01) |
| *B81B 7/00* | (2006.01) |
| *G01P 15/08* | (2006.01) |

(52) U.S. Cl.
CPC .............. *G01P 1/00* (2013.01); *B81B 7/0048* (2013.01); *G01P 1/006* (2013.01); *G01P 15/125* (2013.01); *B81B 2201/0235* (2013.01); *B81B 2203/058* (2013.01); *G01P 2015/0831* (2013.01)

(58) Field of Classification Search
CPC .......................................................... G01P 1/00
USPC ........................................ 73/514.32, 514.36
See application file for complete search history.

(56) References Cited

U.S. PATENT DOCUMENTS

| | | | |
|---|---|---|---|
| 6,230,567 B1 * | 5/2001 | Greiff ........................ | 73/514.37 |
| 7,140,250 B2 * | 11/2006 | Leonardson et al. ...... | 73/504.14 |
| 2011/0023604 A1 * | 2/2011 | Cazzaniga et al. ......... | 73/514.32 |
| 2012/0186346 A1 * | 7/2012 | McNeil et al. ............. | 73/514.32 |

\* cited by examiner

*Primary Examiner* — Hezron E Williams
*Assistant Examiner* — Mark A Shabman
(74) *Attorney, Agent, or Firm* — North Weber & Baugh LLP

(57) ABSTRACT

The invention relates to a microelectromechanical structure, and more particularly, to systems, devices and methods of compensating the effect of the thermo-mechanical stress by incorporating and adjusting elastic elements that are used to couple a moveable proof mass to anchors. The proof mass responds to acceleration by displacing and tilting with respect to a moveable mass rotational axis. The thermo-mechanical stress is accumulated in the structure during the courses of manufacturing, packaging and assembly or over the structure's lifetime. The stress causes a displacement on the proof mass. A plurality of elastic elements is coupled to support the proof mass. Geometry and configuration of these elastic elements are adjusted to reduce the displacement caused by the thermo-mechanical stress.

16 Claims, 6 Drawing Sheets

MICRO-ELECTROMECHANICAL STRUCTURE WITH LOW SENSITIVITY TO THERMO-MECHANICAL STRESS

BACKGROUND

A. Technical Field

The present invention relates to a microelectromechanical structure, and more particularly, to systems, devices and methods of compensating effect of thermo-mechanical stress by incorporating and adjusting elastic elements that are used to couple a moveable proof mass and anchors included in the microelectromechanical structure.

B. Background of the Invention

A microelectromechanical structure is widely applied as a sensor to measure acceleration, rotation, pressure, temperature and many other physical parameters. The microelectromechanical structure is normally formed on a silicon substrate using a micromachining process that results in characteristic feature sizes of several micrometers. Such miniaturized devices may transduce mechanical movement to electrical properties. One typical microelectromechanical structure is a micromachined capacitive accelerometer that comprises a proof mass that is suspended above a silicon substrate.

Figure 1A:
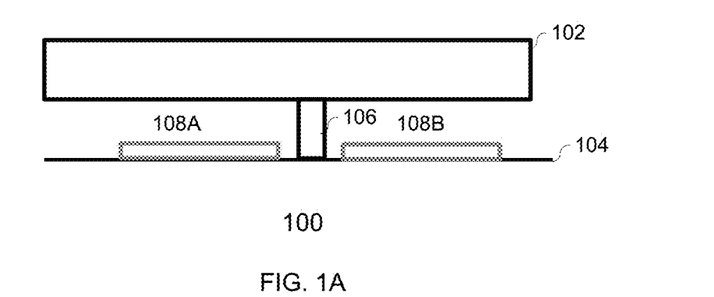
FIG. 1A illustrates a z-axis capacitive accelerometer.
Figure 1B:
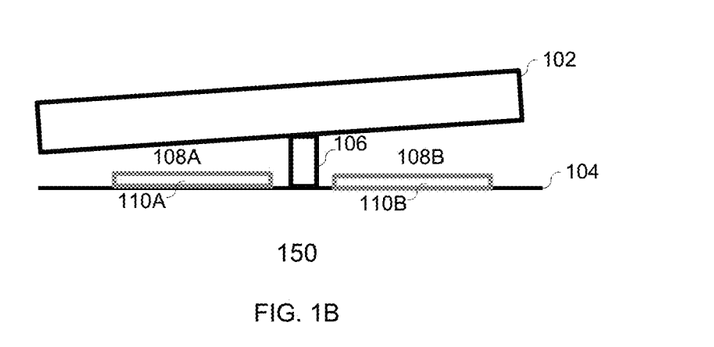
FIG. 1B illustrates its response to an out-of-plane acceleration.

FIG. 1A illustrates a z-axis capacitive accelerometer 100, and FIG. 1B illustrates its response 150 to an out-of-plane acceleration. The z-axis capacitive accelerometer 100 has its moveable proof mass 102 anchored to a substrate 104 via an anchor 106. Electrodes are formed on both the proof mass 102 and the stationary substrate, such that two capacitors 108A and 108B are formed and arranged on two sides of the anchor 106. In response to an out-of-plane acceleration along the z-axis, the proof mass 102 tilts with respect to its rotation axis 106. The gaps between the proof mass 102 and the corresponding electrodes, 110A and 110B, vary differently, and lead to a mismatch between capacitors 108A and 108B. Such a capacitance mismatch is processed by an interface circuit to output a signal that indicates the magnitude of the out-of-plane acceleration.

Thermo-mechanical stress may introduce an intrinsic offset or drift to the output even though no out-of-plane acceleration is applied. In an ideal situation, the capacitance mismatch between capacitors 108A and 108B should only be associated with the out-of-plane acceleration, and does not exist when no out-of-plane acceleration is involved. However, thermo-mechanical stress may be accumulated in the substrate 104 during the course of soldering and packaging, unavoidably causing the substrate to warp. When such warping is symmetric with respect to the anchor 106, the capacitor gap variations happen to cancel out and result in no capacitance mismatch between capacitors 108A and 108B. In most cases, substrate warping is asymmetric. Regardless of how close they could be, gap variations of capacitors 108A and 108B are always different. Such asymmetric gap variations are incorporated into the final output from the interface circuit, and lead to an offset in the sensed acceleration and a sensitivity drift for the accelerometer 100.

Apparently, device performance of the capacitive accelerometer 100 is compromised due to the thermo-mechanical stress in the substrate 104. Such performance degradation is commonly shared by microelectromechanical structures that rely on suspended proof masses for sensing and transducing mechanical movement. A need exists to compensate the thermo-mechanical stress that is built up in the substrate 104 during the course of manufacturing, packaging, assembly and lifetime operation.

SUMMARY OF THE INVENTION

Various embodiments of the present invention relate to a microelectromechanical structure, and more particularly, to systems, devices and methods of compensating effect of thermo-mechanical stress by incorporating and adjusting elastic elements that are used to couple a moveable proof mass and anchors included in the microelectromechanical structure.

One aspect of the invention is a microelectromechanical structure that comprises a substrate, a proof mass, at least one anchor and a plurality of elastic elements. The proof mass is suspended above the substrate, and responds to acceleration by displacing and tilting with respect to a moveable mass rotational axis. The at least one anchor is fixed on the substrate and coupled to support the proof mass. The elastic elements are coupled between the proof mass and the anchor to support the proof mass. Geometry and configuration of these elastic elements are adjusted to reduce a displacement of the proof mass caused by thermo-mechanical stress.

One aspect of the invention is a method of compensating thermo-mechanical stress accumulated in a microelectromechanical structure. A level of the thermo-mechanical stress is first determined. The thermo-mechanical stress causes a displacement on a proof mass that responds to acceleration by displacing and tilting with respect to a moveable mass rotational axis. An offset and a sensitivity drift are subsequently determined according to the level of the thermo-mechanical stress, and those values are associated with an output that is generated by the structure in response to the acceleration. Geometry and configuration of a plurality of elastic elements are adjusted to compensate the offset and the sensitivity drift.

One aspect of the invention is an out-of-plane accelerometer. A proof mass is suspended above the substrate, and responds to acceleration along a z-axis by displacing and tilting with respect to a moveable mass rotational axis in the plane of the proof mass. Elastic elements are coupled to support the proof mass, and geometry and configuration of the elastic elements are adjusted to reduce a displacement of the proof mass caused by thermo-mechanical stress.

Certain features and advantages of the present invention have been generally described in this summary section; however, additional features, advantages, and embodiments are presented herein or will be apparent to one of ordinary skill in the art in view of the drawings, specification, and claims hereof. Accordingly, it should be understood that the scope of the invention shall not be limited by the particular embodiments disclosed in this summary section.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

In the following description, for the purpose of explanation, specific details are set forth in order to provide an understanding of the invention. It will be apparent, however, to one skilled in the art that the invention can be practiced without these details. One skilled in the art will recognize that embodiments of the present invention, described below, may be performed in a variety of ways and using a variety of means. Those skilled in the art will also recognize additional modifications, applications, and embodiments are within the scope thereof, as are additional fields in which the invention may provide utility. Accordingly, the embodiments described below are illustrative of specific embodiments of the invention and are meant to avoid obscuring the invention.

Reference in the specification to "one embodiment" or "an embodiment" means that a particular feature, structure, characteristic, or function described in connection with the embodiment is included in at least one embodiment of the invention. The appearance of the phrase "in one embodiment," "in an embodiment," or the like in various places in the specification are not necessarily all referring to the same embodiment.

Furthermore, connections between components or between method steps in the figures are not restricted to connections that are effected directly. Instead, connections illustrated in the figures between components or method steps may be modified or otherwise changed through the addition thereto of intermediary components or method steps, without departing from the teachings of the present invention.

Various embodiments of the present invention relate to a microelectromechanical structure (MEMS), and more particularly, to systems, devices and methods of compensating effect of thermo-mechanical stress by incorporating and adjusting elastic elements that are used to couple a moveable proof mass and anchors included in the MEMS device. The thermo-mechanical stress in the structure originates from temperature variations experienced over its lifetime or during the courses of manufacturing, packaging, and assembly. The thermo-mechanical stress may impact the positions of the different parts included in the structure, and consequently, the moveable proof mass is subjected to different relative displacement. Device performances, e.g., sensitivity, offset and full scale range of the structure, may be fundamentally compromised. This thermo-mechanical stress affects most MEMS-based sensors because temperature variations are unavoidable during their production processes or over their lifetime. In this invention disclosure, a z-axis out-of-plan accelerometer is used as one particular embodiment to illustrate a stress compensation system, device and method that relies on incorporation and adjustment of the elastic elements.

Figure 2A:
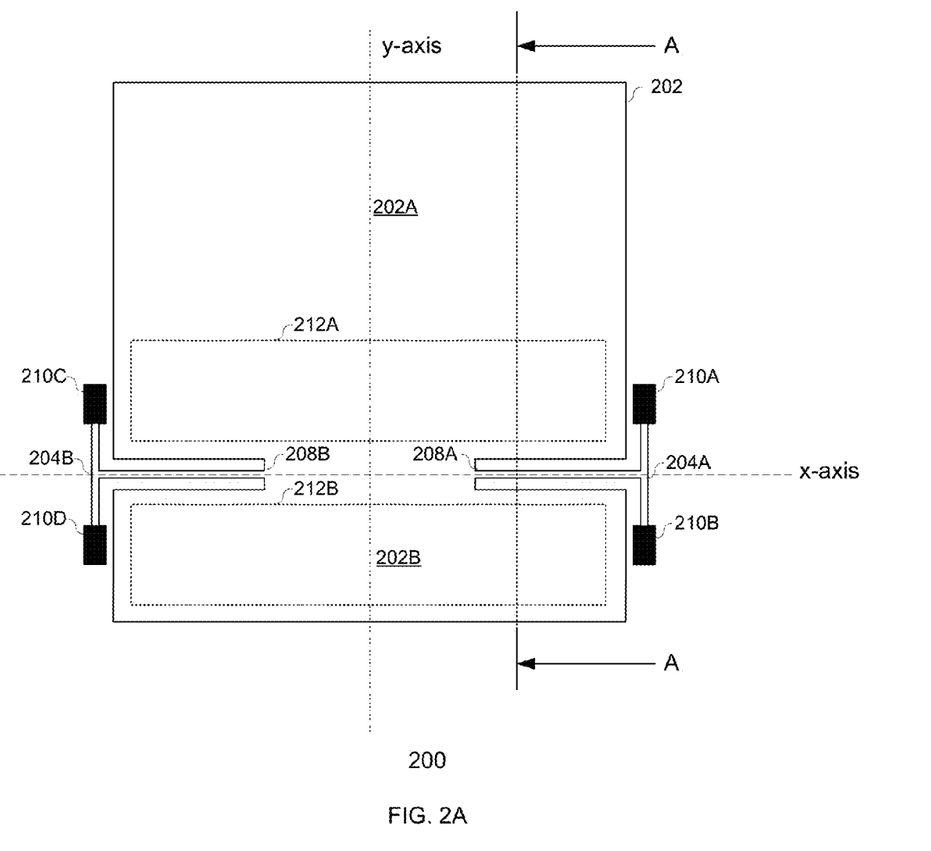
FIG. 2A and FIG. 2B illustrate an exemplary top view and an exemplary cross section of an out-of-plane accelerometer according to various embodiments in the invention.
Figure 2B:
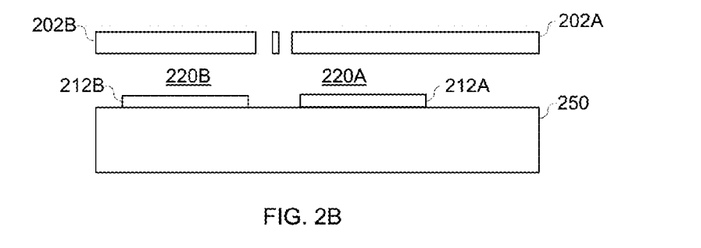

FIG. 2A and FIG. 2B illustrates an exemplary top view and an exemplary cross section of an out-of-plane accelerometer 200 according to various embodiments in the invention. The out-of-plane accelerometer comprises a moveable proof mass 202 that is anchored to a substrate 250 by means of elastic elements 204A and 204B. The elastic elements 204A and 204B are configured to compensate an out-of-place displacement induced by thermo-mechanical stress. As a result, the out-of-plane accelerometer 200 is less sensitive to the thermo-mechanical stress.

The accelerometer 200 is symmetric with respect to a y-axis that is parallel to the proof mass 202 and passes its center. On each side of the y-axis, the moveable proof mass 202 includes one coupling location 208A or 208B. A plurality of anchors are fixed on the substrate 250 and arranged symmetrically with respect to the y-axis on two sides of the proof mass 202. The proof mass 202 is coupled to the substrate 250 via the elastic elements and the anchors.

In this particular embodiment, four anchors 210A, 210B, 210C and 210D are applied. On one side of the y-axis, a first elastic element 204A is used to couple the proof mass 202 to anchors 210A and 210B at coupling location 208A. On the other side of the y-axis, a second elastic element 204B is used to couple the proof mass 202 to anchors 210C and 210D at coupling location 208B.

In one embodiment, the coupling locations 208A and 208B are recessed towards the y-axis. In one embodiment, each of the elastic elements 204A and 204B is configured to a T-shape structure that couples a pair of anchors to the proof mass at a corresponding recessed coupling location.

An x-axis connects the coupling locations 208A and 208B on the proof mass, and divides the moveable proof mass 202 into two panels 202A and 202B. The x-axis constitutes a moveable mass rotational axis with respect to which the proof mass may tilt. Two separate electrodes 212A and 212B are formed on the substrate, and coupled underneath panels 202A and 202B, respectively. In various embodiments of the invention, panels 202A and 202B may have identical or different sizes according to the requirements of the accelerometer 200. Likewise, electrodes 212A and 212B may also adopt identical or different sizes that are not necessarily equal to those of panels 202A and 202B. Two separate capacitors are respectively formed between electrode 212A and panel 202A, and between electrode 212B and panel 202B. In one embodiment, electrodes 212A and 212B are of the same size, so regardless of their panel sizes, these two capacitors have matched capacitance values if their capacitor gaps are equal.

In one embodiment, the out-of-plane accelerometer 200 is manufactured from a surface micromachining process. In view of the cross section at line A (FIG. 2B), the substrate 250 is made of silicon, and a layer of conducting film is deposited on the substrate 250. This layer of film is polysilicon or metal, and both electrodes 212A and 212B are formed on this layer of film. A sacrificial layer is subsequently deposited to cover electrodes 212A and 212B, and openings are etched out on the sacrificial layer to reserve locations for anchors 210A-210D. These openings are filled when an additional layer of mass material is deposited on the top of the sacrificial layer. The proof mass 202, the elastic elements 204A and 204B, and the anchors 210A-210D are subsequently patterned out of the layer of mass material. The surface micromachining process ends with a final step of removing the sacrificial layer and releasing the accelerometer 200, and the proof mass 202 is suspended and anchored to the substrate 250 via anchors 210A-210D.

In certain embodiments, additional layers of mass materials may be deposited on panels 202A and 202B, and the proof mass 202 may have a different thickness from that of the elastic elements. These additional layers of mass materials do not have to remain the same as the mass material used for the elastic elements.

This accelerometer 200 has to be electrically coupled, safely packaged, and assembled in a sensing system. In various embodiments, the accelerometer 200 is a stand-alone device protected in a socket package or a hermetic package. The hermetic package may be formed in a wafer bonding process. In various embodiments, the wafer bonding process relies on a glass-to-silicon, silicon-to-silicon, metal-to-metal or silicon-to-metal bonding between the substrate 250 and a package cover. Both electrodes 212A-212B and the proof mass 202 are coupled out of the hermetic package. In certain embodiments, the accelerometer 200 is a device integrated with a read out circuit formed on the same substrate 250. The integrated accelerometer 200 has to be similarly protected in a package and electrically coupled out.

Thermo-mechanical stress is introduced during the above manufacturing, packaging and assembly processes. The electrodes and the proof mass may be formed inside an ambient at an enhanced temperature. Hermetic packaging and bonding procedures may be associated with an enhanced temperature as well. When the accelerometer 200 is cooled down and operates at the room temperature, thermal-mechanical stress is built up, causing slight substrate warping and proof mass deformation. A displacement is caused by the thermo-mechanical stress on two sides of the moveable mass rotational axis, x-axis, of the proof mass.

Figure 3A:
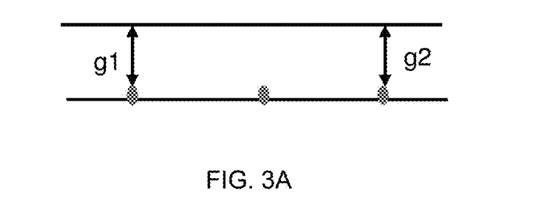
FIGS. 3A-3C illustrate impact of substrate warping on capacitor gaps according to various embodiments in the invention.
Figure 3B:
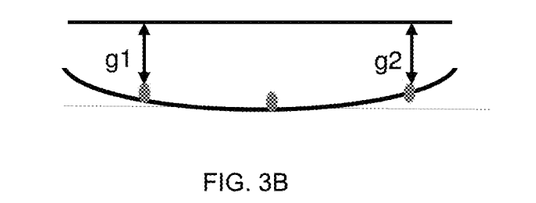
Figure 3C:
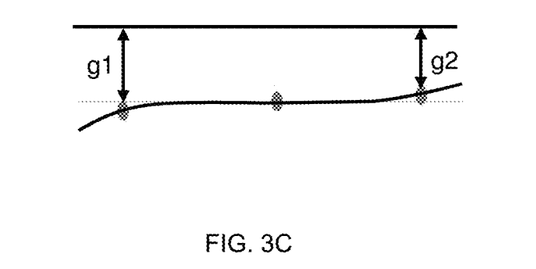

FIGS. 3A-3C illustrate impact of substrate warping on capacitor gaps according to various embodiments in the invention. The gaps for two capacitors 220A and 220B are equal out of an ideal manufacturing and packaging process, and thus, their capacitances match with each other (FIG. 3A). In rare cases, substrate warping is symmetric with regard to the x-axis, and the gaps, g1 and g2, deviate in an identical direction (FIG. 3B). Although capacitance drifts of capacitors 220A and 220B happen to cancel out, a sensitivity of the accelerometer is changed due to the gap deviation.

In most cases, regardless of how small they are, the capacitance variations of capacitors 220A and 220 do not match (FIG. 3C). An offset and a sensitivity drift may be incorporated into a sensed out-of-plane acceleration, because this acceleration is derived from the capacitance variation.

In various embodiments of the present invention, the elastic elements 204A and 204B are configured to compensate the thermal-mechanical stress. In one embodiment, each of the elastic elements 204A and 204B is primarily adjusted along the y-axis, i.e., asymmetrically with respect to the x-axis, to compensate effects of the thermo-mechanical stress on these two capacitors. This is particularly due to the reason that the capacitors 220A and 220B are arranged on two opposite sides of the x-axis.

Figure 4A:
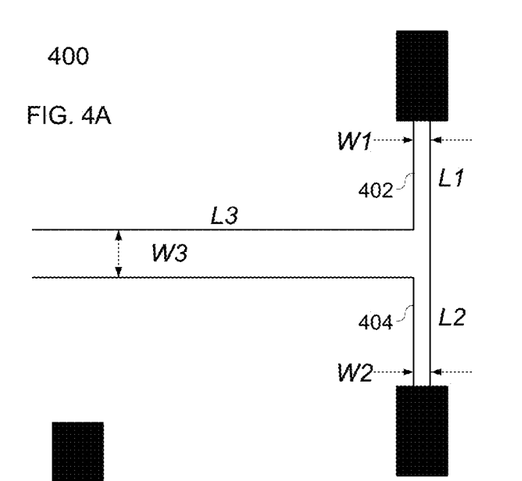
FIG. 4A illustrates an exemplary diagram of a T-shaped elastic element according to various embodiments of the invention.

FIG. 4A illustrates an exemplary diagram of a T-shaped elastic element 400 according to various embodiments of the invention. In addition to the lengths L1, L2 and L3, the width of each individual arm or leg (W1, W2 or W3) is adjustable as well. The locations of recesses 208A-208B and anchors 210A-210D are adjusted accordingly to render desirable lengths and widths. Moreover, the thickness of the T-shaped elastic element 400 may be globally varied as well. These geometrical parameters are associated with stiffness of the elastic element 400, and their adjustment may impact corresponding sensor performance, such as the sensitivity and the full scale range.

Figure 4B:
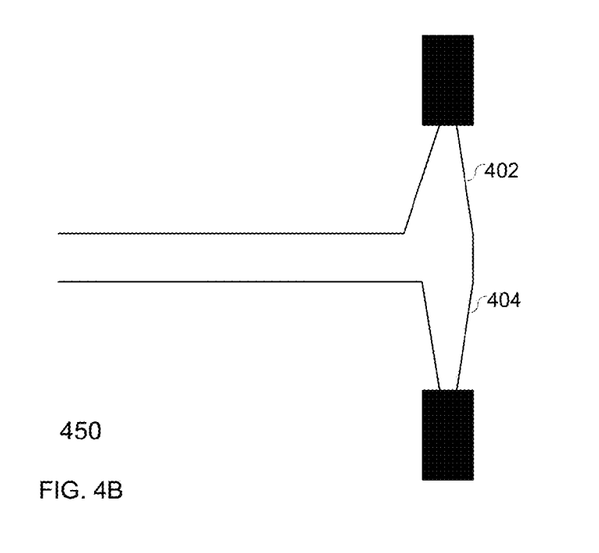
FIG. 4B illustrates another exemplary diagram of a T-shaped elastic element according to various embodiments of the invention.

To effectively compensate the thermal-mechanical stress, the widths and the lengths of the two arms of the T shape have to be particularly configured. Two elastic elements 400 are applied to support the accelerometer 200, and they are identical elastic elements that mirror to each other with respect to the y-axis. Each elastic element has to adopt two arms to compensate the thermal-mechanical stress, and these two arms are not necessarily symmetric. In one embodiment, arm 402 has a larger width W1 but a shorter length L1 than a width W2 and a length L2 of arm 404, respectively. FIG. 4B illustrates another exemplary diagram 450 of a T-shaped elastic element according to various embodiments of the invention. Arms 402 and 404 have tapered widths that widen at different angles.

Figure 4C:
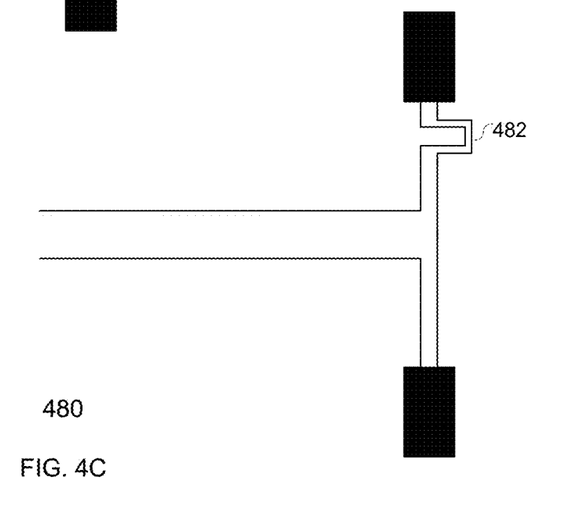
FIG. 4C illustrates another exemplary diagram of a T-shaped elastic element that incorporates a detour on one arm according to various embodiments of the invention.

FIG. 4C illustrates an exemplary diagram 480 of a T-shaped elastic element that incorporates a detour on one arm according to various embodiments of the invention. A detour 482 is used to adjust the gap variations coming from substrate deformation. The size, position and shape of the detour are determined according to a substrate deformation level and the configuration of the elastic elements.

In one embodiment, the other arm also incorporates another detour that may have a different size, shape or location. In certain embodiments, more than one detour may be applied along one arm or along both arms. The number of the detours is also determined according to the substrate deformation level and the configuration of the elastic elements. In certain embodiments, sections of one arm are entirely replaced with detours, and the arm adopts a serpentine shape.

Figure 5:
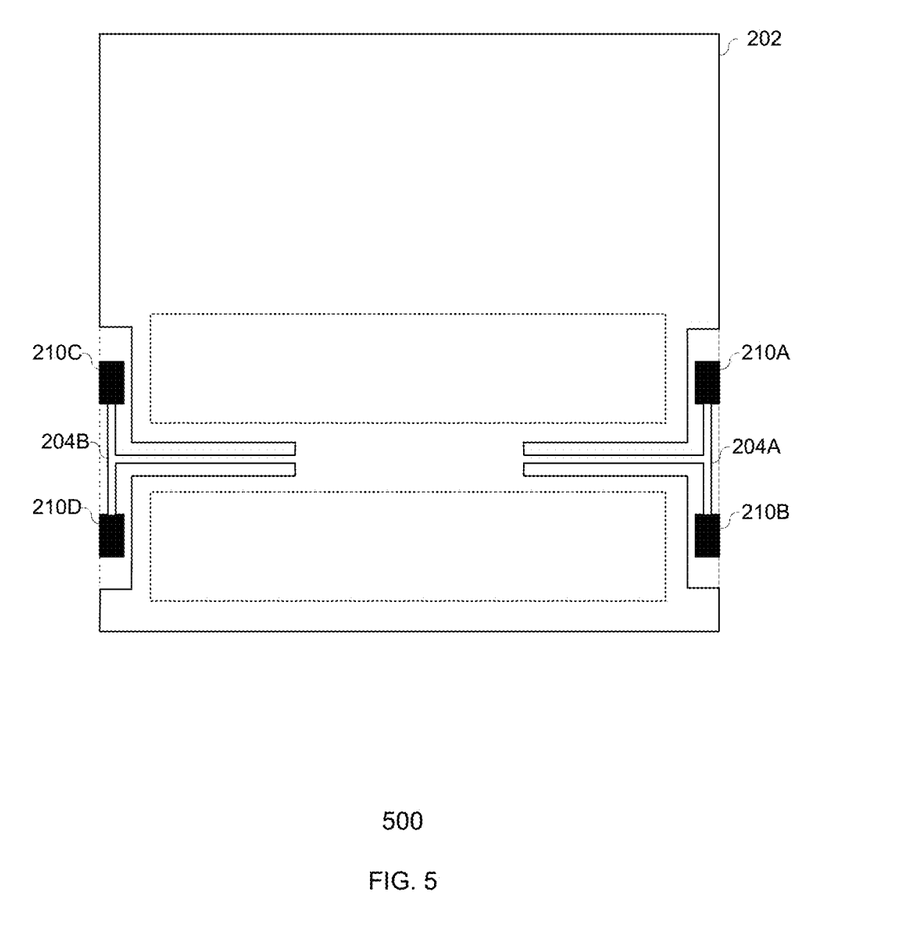
FIG. 5 illustrates an exemplary diagram of an out-of-plane accelerometer that saves chip estate according to various embodiments of the invention.

FIG. 5 illustrates an exemplary diagram of an out-of-plane accelerometer 500 that saves chip estate according to various embodiments of the invention. Anchors 210A-210D are also recessed towards the y-axis and fully enclosed in an outline footprint of the proof mass 202. Elastic elements 204A and 204B are configured to compensate the thermo-mechanical stress that is built up during the course of manufacturing, packaging and assembly. The geometry of the proof mass 202 is adjusted to accommodate configurations of the elastic elements. Accordingly, the chip estate may be saved, while the size of the proof mass is maximized for enhanced sensitivity.

Figure 6:
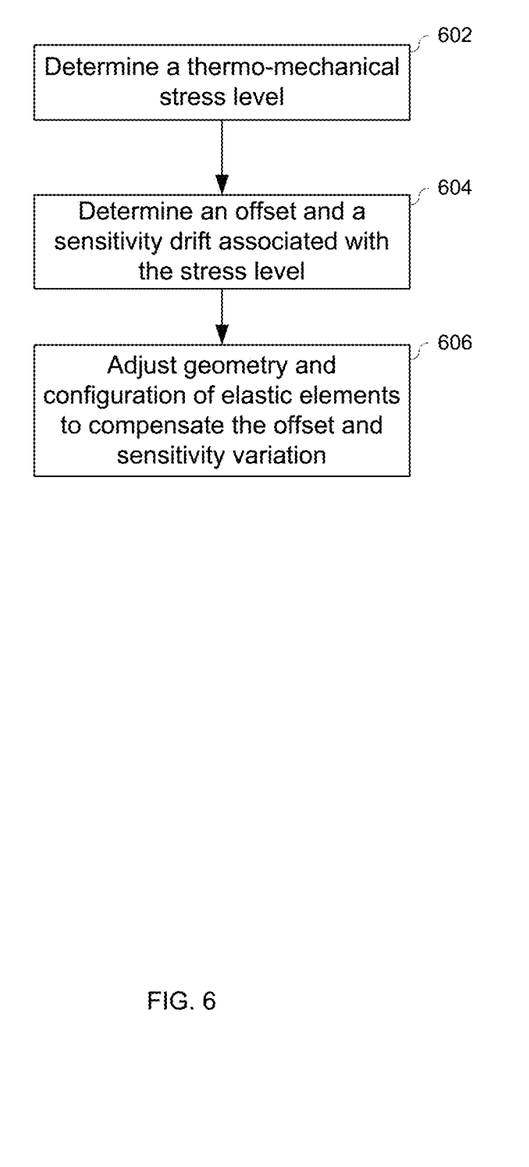
FIG. 6 illustrates an exemplary flow chart of a method of compensating thermo-mechanical stress according to various embodiments in the invention.

FIG. 6 illustrates an exemplary flow chart 600 of a method of compensating thermo-mechanical stress accumulated in a MEMS device according to various embodiments in the invention. The thermo-mechanical stress causes displacement to both sides of a proof mass that responds to acceleration by displacing and tilting with respect to the moveable mass rotational axis, i.e., x-axis. At step 602, thermo-mechanical stress level is determined for the structure. In one embodiment, empirical thermo-mechanical stress levels are recorded for different devices that are manufactured, packaged and assembled according to a particular procedure. These empirical thermo-mechanical stress levels are analyzed using a Monte Carlo method to provide a nominal stress level that may be used to configure the elastic elements.

At step 604, the thermo-mechanical stress level is converted to an offset value and a sensitivity drift. In one embodiment, the offset value and the sensitivity drift are associated with the sensed out-of-plane acceleration, and thus, represented in a unit of g, i.e., the acceleration of gravity. At step 606, a plurality of elastic elements is incorporated to support the proof mass, and the geometry and configuration of the elements are adjusted to compensate the offset and the sensitivity drift. The elastic elements are coupled at the coupling locations symmetrically arranged on two opposite sides of the proof mass. In various embodiments of the invention, the elastic elements may adopt various widths, lengths and shapes to its arms, or incorporate one or a number of detours on its arms.

One of those skilled in the art knows that an out-of-plane accelerometer 200 is used as an example of a MEMS device based on a moveable proof mass. This MEMS device may be applied to sense other parameters besides acceleration. The MEMS relies on a proof mass to respond to any other parameters, and the proof mass is coupled to at least one anchor by elastic elements. The thermo-mechanical stress built up in such a MEMS device may be compensated by adjusting geometry and configuration of elastic elements that are used to support a proof mass according to the methods detailed in the present invention.

While the invention is susceptible to various modifications and alternative forms, specific examples thereof have been shown in the drawings and are herein described in detail. It should be understood, however, that the invention is not to be limited to the particular forms disclosed, but to the contrary, the invention is to cover all modifications, equivalents, and alternatives falling within the scope of the appended claims.

We claim:

1. A microelectromechanical structure, comprising:
a substrate;
a proof mass, suspended above the substrate, the proof mass responding to acceleration by displacing and tilting with respect to a moveable mass rotational axis that is located in the plane of the proof mass;
at least one anchor, fixed on the substrate, the at least one anchor being coupled to support the proof mass; and
a plurality of elastic elements, connected to the at least one anchor and the proof mass, geometry and configuration of the plurality of elastic elements being adjusted to reduce a displacement of the proof mass caused by thermo-mechanical stress with respect to the moveable mass rotational axis, wherein a first subset and a second subset of the plurality of elastic elements are arranged to support the proof mass from two opposite sides, and the first and second subsets of elastic elements mirror each other in their geometry and configuration with respect to a central line that is perpendicular to the moveable mass rotational axis and passes a center of the proof mass.

2. The microelectromechanical structure according to claim 1, further comprising two electrodes that are attached to the substrate on two opposite sides of the moveable mass rotational axis, the two electrodes forming two separate capacitors with the proof mass, a mismatch between capacitances of the two capacitors being associated with both the acceleration and the thermo-mechanical stress.

3. The microelectromechanical structure according to claim 1, wherein the structure is applied to detect an out-of-plane acceleration that is perpendicular to the plane of the proof mass.

4. The microelectromechanical structure according to claim 1, wherein at least one of the plurality of elastic elements is a T-shaped element having its leg to couple at the proof mass, and its arms to anchor at the at least one anchor.

5. The microelectromechanical structure according to claim 4, wherein the arms of the T-shaped element are located on the two opposite sides of the moveable mass rotational axis and have widths and lengths that are designed to reduce a displacement caused by thermo-mechanical stress on the two opposite sides.

6. The microelectromechanical structure according to claim 4, wherein the arms of the T-shaped element are located on the two opposite sides of the moveable mass rotational axis, and have tapered widths that widen at different taper angles.

7. The microelectromechanical structure according to claim 4, wherein at least one of the arms of the T-shaped element includes at least one detour structure.

8. The microelectromechanical structure according to claim 1, wherein the proof mass is recessed along the moveable mass rotational axis at coupling locations where the plurality of elastic elements are coupled.

9. The microelectromechanical structure according to claim 8, wherein the proof mass is further recessed at the locations for the at least one anchor, such that both the at least one anchor and the plurality of elastic elements are included in an outline of the proof mass.

10. A method of compensating thermo-mechanical stress accumulated in a microelectromechanical structure, comprising the steps of:
determining a level of the thermo-mechanical stress that is accumulated in the structure, the thermo-mechanical stress causing a displacement to a proof mass that responds to acceleration by displacing and tilting with respect to a moveable mass rotational axis;
determining an offset value and a sensitivity drift associated with an output according to the level of the thermo-mechanical stress, the output being generated by the structure in response to the acceleration; and
adjusting geometry and configuration of a plurality of elastic elements to compensate the offset and the sensitivity drift, the plurality of elastic elements, connected to at least one anchor and the proof mass, being applied to support the proof mass, wherein at least one of the plurality of elastic elements is a T-shaped element having its leg to couple at the proof mass, and its arms to anchor at the at least one anchor, and wherein the arms of the T-shaped element are located on the two opposite sides of the moveable mass rotational axis and have widths and lengths that are designed to reduce a displacement caused by thermo-mechanical stress on the two opposite sides.

11. The method according to claim 10, wherein the arms of the T-shaped element are located on the two opposite sides of the moveable mass rotational axis, and have tapered widths that widen at different taper angles.

12. The method according to claim 10, wherein at least one of the two arms of the T-shaped element includes at least one detour structure.

13. The method according to claim 10, wherein the proof mass is recessed along the moveable mass rotational axis at coupling locations where the plurality of elastic elements are coupled.

14. An out-of-plane accelerometer, comprising:
a substrate;
a proof mass, suspended above the substrate, the proof mass responding to acceleration along a z-axis by displacing and tilting with respect to a moveable mass rotational axis that is located in the plane of the proof mass;
at least one anchor, fixed on the substrate, the at least one anchor being coupled to support the proof mass; and
a plurality of elastic elements, connected to the at least one anchor and the proof mass, geometry and configuration of the plurality of elastic elements being adjusted to reduce a displacement caused by thermo-mechanical stress on two sides of the moveable mass rotational axis, wherein a first subset and a second subset of the plurality of elastic elements are arranged to support the proof mass from two opposite sides of the proof mass, respectively, and the first and second subsets of elastic elements mirror each other in their geometry and configuration with respect to a central line that is perpendicular to the moveable mass rotational axis and passes a center of the proof mass.

15. The out-of-plane accelerometer according to claim 14, wherein at least one of the plurality of elastic elements is a T-shaped element having its leg to couple at the proof mass, and its arms to anchor at the at least one anchor.

16. The out-of-plane accelerometer according to claim 14, wherein the proof mass is recessed both along the moveable mass rotational axis at coupling locations where the plurality of elastic elements are coupled, and at the locations for the at least one anchor, such that both the at least one anchor and the plurality of elastic elements are included in an outline of the proof mass.

* * * * *